United States Patent
Baeckler et al.

(10) Patent No.: US 7,249,329 B1
(45) Date of Patent: Jul. 24, 2007

(54) TECHNOLOGY MAPPING TECHNIQUES FOR INCOMPLETE LOOKUP TABLES

(75) Inventors: Gregg William Baeckler, San Jose, CA (US); Jinyong Yuan, Cupertino, CA (US); David W. Mendel, Sunnyvale, CA (US)

(73) Assignee: Altera Corporation, San Jose, CA (US)

( * ) Notice: Subject to any disclaimer, the term of this patent is extended or adjusted under 35 U.S.C. 154(b) by 320 days.

(21) Appl. No.: 10/859,325

(22) Filed: Jun. 1, 2004

(51) Int. Cl.
*G06F 17/50* (2006.01)

(52) U.S. Cl. .............................................. 716/3; 716/1
(58) Field of Classification Search ................ 716/3–6, 716/1
See application file for complete search history.

(56) References Cited

U.S. PATENT DOCUMENTS

| | | | |
|---|---|---|---|
| 5,636,368 A * | 6/1997 | Harrison et al. ............... | 716/16 |
| 6,631,503 B2 * | 10/2003 | Hsu et al. ....................... | 716/4 |
| 7,020,855 B2 * | 3/2006 | Wallace ......................... | 716/2 |
| 7,028,281 B1 * | 4/2006 | Agrawal et al. ............... | 716/12 |

OTHER PUBLICATIONS

U.S. Appl. No. 10/694,919, filed Oct. 27, 2003, Hwang et al.

Cong et al. "Combinational logic synthesis for (LUT) based field programmable gate arrays," ACM Trans. Des. Autom. Electron. Syst. 1(2):145-204 (1996).

Cong et al. "Boolean Matching for LUT-Based Logic Blocks With Applications to Architecture Evaluation and Technology Mapping," IEEE Transactions on Computer-Aided Design of Integrated Circuits and Systems, 20(9):1077-1090 (2001).

* cited by examiner

*Primary Examiner*—Jack Chiang
*Assistant Examiner*—Binh Tat
(74) *Attorney, Agent, or Firm*—Townsend and Townsend and Crew LLP

(57) ABSTRACT

Technology mapping techniques for determining whether a function can be implemented using an incomplete lookup table (LUT) are provided. For example, the output of a function is compared to the output of an incomplete LUT for each binary value of the function's input signals and for each binary value of the bits stored in the incomplete LUT. For a LUT that is functionally asymmetric, the process can be repeated for multiple permutations of the input signals with respect to the input terminals of the LUT. As another example, the user function is converted into a network of multiplexers and complete LUTs, which are analyzed to determine if an incomplete LUT can implement the function. As another example, a truth table is constructed for a function. The truth table variables are then tested one by one as candidates for each input position using co-factoring and dependency checking.

18 Claims, 7 Drawing Sheets

TECHNOLOGY MAPPING TECHNIQUES FOR INCOMPLETE LOOKUP TABLES

BACKGROUND OF THE INVENTION

The present invention relates to technology mapping techniques for incomplete look-up tables, and more particularly, to techniques for determining functions in a circuit design can be implemented by incomplete lookup tables.

A lookup table is a memory circuit that stores binary bits of information. A lookup table can emulate a logic function that generates output values in response to receiving values of input signals. Each possible output of the logic function is stored in the lookup table at a memory address that matches corresponding values of the input signals.

A lookup table (LUT) can have any number of input terminals that receive input signals. A complete LUT has enough memory to store every ($2^N$) binary value of its N input signals. For example, a complete 4 input LUT has enough memory to store 16 output bits that correspond to every binary value of the 4 input signals ($2^4$=16).

The term "incomplete LUT" is used to refer to a LUT that has less than $2^N$ bits of memory to store output bits for every binary value of its N input signals. For example, a 5 input LUT can receive $2^5$=32 possible binary values of its 5 input signals. A 5 input LUT is an incomplete LUT if it only has enough memory to store 16 different output bits.

Many reasonable configurations for incomplete LUTs have been made. For example, a 5 input incomplete LUT can be made from two 3 input LUTs and a multiplexer. The 3 input LUTs have two shared input signals. The fifth input signal controls the select terminal of the multiplexer. The multiplexer has two inputs that are coupled to the outputs of the LUTs.

A 7 input incomplete LUT can also be built from two 3 input LUTs and a multiplexer. The two 3 input LUTs have no shared input signals. The seventh input signal controls the select terminal of the multiplexer. The multiplexer has two inputs that are coupled to the outputs of the LUTs.

A different 7 input incomplete LUT can be built from a 5 LUT feeding a multiplexer. The LUT and sixth input signal feed the two data terminals of the multiplexer. The seventh input feeds the select terminal of the multiplexer."

The number of functions that a LUT can implement equals $2^M$, where M is the number of storage bits in the LUT. However, not all of the functions that a complete LUT can implement are necessarily unique or useful. A complete 4 input LUT and the incomplete 5 input LUT described above can each implement 65536 functions. A complete 5 input LUT can implement about 4 billion functions.

The amount of area that is required to built a LUT on a silicon chip is proportional to the storage space in the LUT. An incomplete LUT uses far less silicon area than a complete LUT that has the same number of inputs, because incomplete LUTs have less storage space.

Technology mapping is a term that refers to the process of converting an arbitrary circuit design into an equivalent circuit that can be programmed onto a programmable integrated circuit such as field programmable gate array (FPGA). Most FPGAs use LUTs to implement logic functions. Technology mapping algorithms convert a circuit design into a network of available LUTs and other programmable circuit elements.

Traditional technology mapping algorithms operate on the assumption that all LUTs are complete in the sense described above. Such traditional algorithms assume, for example, that any 5 input function can be implemented in a 5 input LUT. However, it may not be possible to implement a 5 input logic function in an incomplete 5 input LUT. An incomplete 5 input LUT may not have enough memory storage space to store all of the possible output values of a 5 input function.

It would be desirable to use incomplete LUTs in technology mapping tools, because incomplete LUTs can implement functions using less storage space than complete LUTs having the same number of inputs. Therefore, it would be desirable to provide technology mapping techniques that determine whether functions in a circuit design can be fully implemented using incomplete LUTs.

BRIEF SUMMARY OF THE INVENTION

The present invention provides technology mapping techniques for determining whether a function can be implemented using an incomplete lookup table (LUT). According to one embodiment of the present invention, the output of a function is compared directly to the output of an incomplete LUT using an exclusive OR (XOR) gate. The comparison is repeated for each binary value of the function's input signals. The outputs of each comparison are evaluated by an OR gate. The process can be repeated for each possible binary value of the bits stored in the incomplete LUT. For a LUT that is functionally asymmetric, the process is repeated for multiple rotations of the input signals with respect to the input terminals of the LUT.

According to another embodiment of the present invention, the user function is converted into a network of 2:1 multiplexers and complete LUTs. The network is then analyzed directly by a process to determine if a specific incomplete LUT can implement the function.

According to yet another embodiment of the present invention, a truth table is constructed for a function. The truth table variables are then tested one by one as candidates for each input position using two types of operations. The operations include co-factoring and dependency checking. Co-factoring is splitting the truth table into two halves corresponding to a given variable being high and low. Dependency checking is testing whether the value of a given variable effects the output of a truth table. This embodiment can also be performed using a binary decision diagram (BDD) instead of a truth table.

Other objects, features, and advantages of the present invention will become apparent upon consideration of the following detailed description and the accompanying drawings, in which like reference designations represent like features throughout the figures.

DETAILED DESCRIPTION OF THE INVENTION

According to a first embodiment of the present invention, a test procedure compares the outputs of an arbitrary function with the outputs of an incomplete lookup table (LUT) to determine if the LUT can implement the function. The incomplete LUT is tested for every binary value of the input signal and every binary value of the bits stored in the LUT's memory to determine if the LUT can implement the function.

Figure 1A:
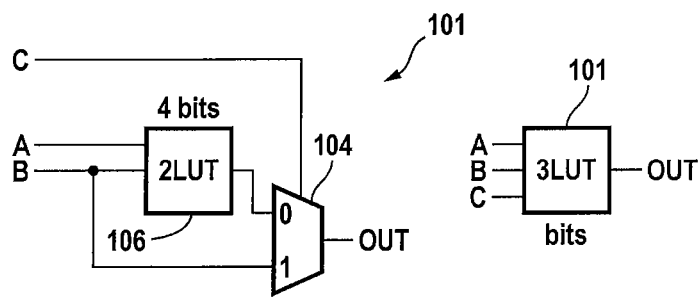
FIG. 1A illustrates an example of a three input incomplete LUT.

FIG. 1A illustrates an example of a 3 input incomplete LUT 101. LUT 101 receives input signals A, B, and C and generates output signal OUT. Incomplete LUT 101 includes a 2 input LUT 106 and a 2-to-1 multiplexer 104 as shown in FIG. 1A. LUT 106 includes 4 bits of storage space, and therefore, LUT 101 has only 4 bits of storage space. A complete 3 input LUT has enough storage space to store 8 ($2^3$) unique binary output bits. LUT 101 can only store 4 unique binary output bits, making it an incomplete LUT.

Figure 1B:
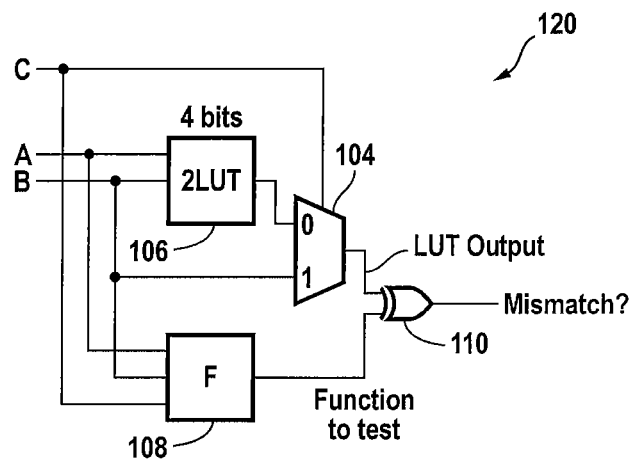
FIGS. 1B-1D illustrate an embodiment of the present invention that determines whether an incomplete 3 input LUT can implement a function.

FIG. 1B illustrates an embodiment of a test system 120 that determines whether LUT 101 can implement an arbitrary 3 input function 108. Test system 120 includes function 108 and LUT 101, which includes LUT 106 and multiplexer 104.

System 120 is preferably a test process that is implemented in software to determine if LUT can implement function 108. For example, LUT 101 and function 108 can be modeled and tested in a binary decision diagram built in software.

Both LUT 101 and function 108 receive input signals A, B, and C and generate an output signal. The output signals of LUT 101 and function 108 are compared by XOR gate 110, which can also be implemented as a software function.

XOR gate 110 outputs a 0 (a logic low) when both outputs of LUT 101 and function 108 are the same. XOR gate 110 outputs a 1 (a logic high) when the outputs of LUT 101 and function 108 are different. The output of XOR gate 110 indicates whether there is a mismatch between the outputs of LUT 101 and function 108.

LUT 106 is a 2 input LUT that stores 4 possible output bits. The binary values of the bits stored in LUT 106 effect whether LUT 101 can implement function 108. Therefore, a test procedure of the present invention tests all binary values of the bits that can be stored in LUT 106 to determine whether LUT 101 can implement function 108.

Figure 1C:
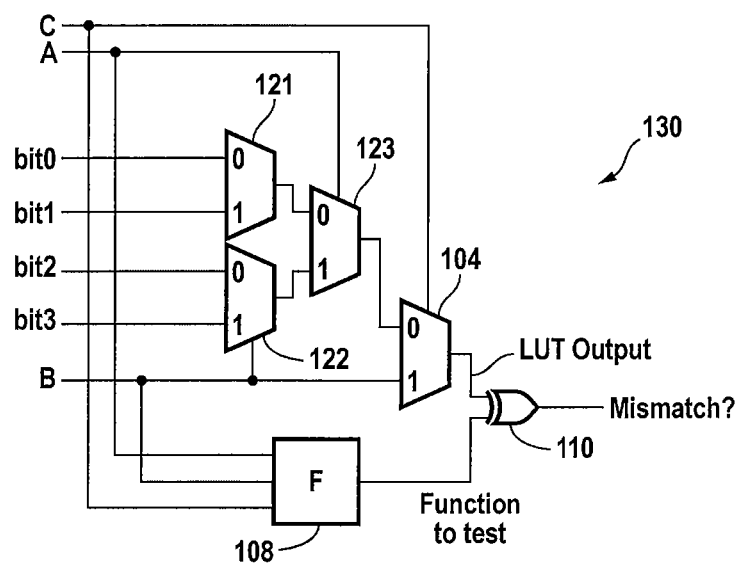

FIG. 1C illustrates a test system 130 of the present invention that can determine which binary values stored in LUT 106 allow LUT 101 to implement function 108. In system 130, LUT 106 is replaced with three 2-to1 multiplexers 121, 122, and 123. Multiplexers 121 and 122 receive inputs bit0, bit1, bit2, and bit3. Inputs bit0, bit1, bit2, and bit3 represent the binary values that are stored in memory in LUT 106. A binary decision diagram (BDD) is used to determine which values of bit0-bit3 allow LUT 101 to implement function 108 as discussed in further detail below.

LUT 101 can only implement function 108 if LUT 101 generates the same output values as function 108 for each binary value of the input signals A, B, and C. To determine whether LUT 101 can implement function 108, the output of LUT 101 is compared against the output of function 108 for every binary value of the input signals A, B, and C.

Figure 1D:
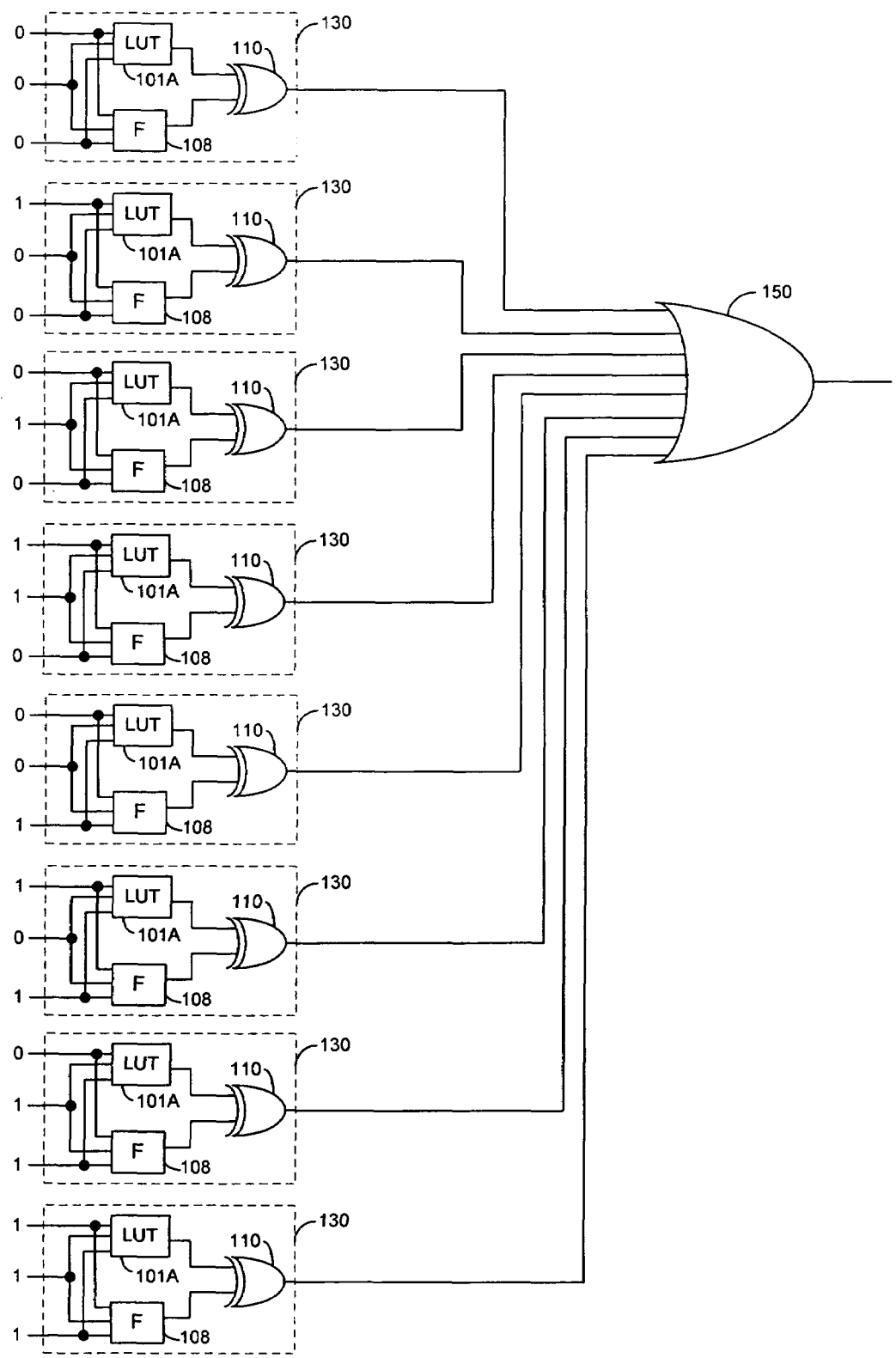

FIG. 1D illustrates how the outputs of LUT 101A can be compared with the outputs of function 108 using OR gate 150 for each binary value of input signals A, B, and C. LUT 101A in FIG. 1D represents multiplexers 121-123 and 104 coupled as shown in FIG. 1C. There are 8 ($2^3$) unique binary values of the three input signals A, B, and C. Eight test systems 130 compare the output of LUT 101A to the output of function 108 for each of the 8 binary values of the input signals. As shown in FIG. 1D, the eight binary values of the input signals are 000, 001, 010, 011, 100, 101, 110, and 111.

The output signals of the 8 XOR gates 110 are transmitted to the inputs of OR gate 150. The output signal of OR gate 150 indicates whether incomplete LUT 101 can implement function 108. If the output of OR gate 150 is 0, then there is no mismatch between the output of LUT 101A and the output of function 108 for any of the 8 binary values of the input signals A, B, and C. A zero output from OR gate 150 indicates that incomplete LUT 101 can implement function 108 for selected values of bit0, bit1, bit2, and bit3.

If the output of OR gate 150 is 1, then there is a mismatch between the output of LUT 101A and the output function 108 for at least one of the 8 binary values of the input signals A, B, and C. A one output from OR gate 150 indicates that incomplete LUT 101 cannot implement function 108 for the selected values of bit0, bit1, bit2, and bit3.

The test system shown and described with respect to FIG. 1D is preferably modeled in software by a binary decision diagram (BDD). The XOR and OR functions of FIG. 1D are performed using the BDD. BDDs are well known to those of skill in the art. The BDD technique is a fast and efficient way to determine if LUT 101 can implement function 108. However, the test runtime and memory requirements can be cumbersome with functions that have a large number of inputs.

Figure 1E:
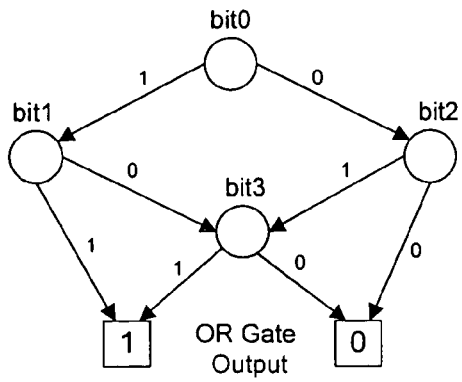
FIG. 1E illustrates an example of a binary decision diagram that can be used to determine the binary values that need to be stored in an incomplete LUT to implement a function according to an embodiment of the present invention.

According to an embodiment of the present invention, the output of an incomplete LUT are compared to the output of a function for each binary value of the input signals, as shown for example in FIG. 1D. A test system according to this embodiment can be modeled as a BDD. FIG. 1E illustrates an example of a binary decision diagram (BDD) that can model as test system according to this embodiment invention.

Each round node in the BDD represents a storage bit in the incomplete LUT. The square end points of the BDD represent the possible values of the OR gate 150 output. End point 1 represents a 1 output at OR gate 150, and end point 0 represents a 0 output at OR gate 150. The arrows between the nodes represent the possible values for bits bit0-bit3.

Each complete path from the starting point (bit0) to the square node 0 represents binary values for bit0-bit3 that allow LUT 101 to implement function 8. For example, a path from bit0 to bit2 ends at end point 0. This path represents zero values for bit0 and bit2. Because the path ends at end point 0, which represents a 0 output from OR gate 150, LUT

101 can implement function 108 if the stored LUT values bit0 and bit2 are both zero. Any values for bit1 and bit3 will result in LUT 101 being able to implement function 108 as long as bit0 and bit2 are 0.

Another possible path from bit0 to bit1 to bit3 leads to end point 0. This path represents a 1 value for bit0 and 0 values for bit1 and bit3. As long as these values are stored in LUT 101 for bit0, bit1, and bit3, any value of bit2 will allow LUT 101 to implement function 108 according to the BDD of FIG. 1E. The BDD of FIG. 1E has three valid paths to end point 0.

If the BDD for a test system does not have a valid path to a zero end point output for the OR gate, and the incomplete LUT is a symmetric LUT, then the incomplete LUT cannot implement the function. However, an incomplete LUT that is asymmetrical may generate different sets of functions depending on how the input signals are coupled to its input terminals.

For example, LUT 101 is asymmetric, because one input signal is coupled to the select terminal of multiplexer 104, while the other two input signals are coupled to inputs of LUT 106. If a particular placement of input signals A, B and C on the input terminals of LUT 101 does not enable LUT 101 to implement function 108, the input signals are permutated with respect to the input terminals of LUT 101, and the above described test procedures are repeated.

In the event that OR gate 150 does not output a 0 value for any of the 16 unique binary values of bit0, bit1, bit2, and bit3, input signals A/B/C are permutated with respect to the input terminals of LUT 101. The above test procedures are then repeated. For example, input signals A and B can be swapped. Input signal A is now coupled to the select terminal of multiplexer 104, and input signals B and C are coupled to inputs of LUT 106.

After input signals A, B, and C have been permutated, a new BDD is constructed for the test system to determine if any values of bit0, bit1, bit2, and bit3 allow incomplete LUT 101 to implement function 108. A valid path through the BDD to a zero end point indicates that LUT 101 can implement function 108 for the corresponding binary value of bit0-bit3 and the second permutation of input signals A, B, and C.

If no valid path exists through the BDD to a zero end point, incomplete LUT 101 cannot implement function 108 for the second permutation of input signals A/B/C. The input signals are then permutated again with respect to the input terminals of LUT 101. In the third permutation, input signal B is coupled to the select input of multiplexer 104, and input signals A and C are coupled to the inputs of LUT 106.

After input signals A, B, and C have been permutated again, a new BDD is constructed for the test system to determine if any values of bit0, bit1, bit2, and bit3 allow incomplete LUT 101 to implement function 108. A valid path through the BDD to a zero end point indicates that LUT 101 can implement function 108 for the corresponding binary value of bit0-bit3 and the third permutation of input signals A, B, and C.

If no valid path exists through the BDD to a zero end point, incomplete LUT 101 cannot implement function 108 for the third permutation of input signals A/B/C. Six ($2^3$) permutations of the input signals are possible for LUT 101. Swapping the inputs of a symmetric LUT does not count as a unique permutation of the input signals.

Input signals in portions of an incomplete LUT that are symmetric do not need to be permutated. For example, if LUT 101 was an incomplete 4 input LUT in which the 1 input of multiplexer 104 was driven by an input signal D instead of B, 24 permutations of the 4 input signals are possible. However, only 12 of these permutations need to be tested, because inputs and A and B are now interchangeable.

Figure 2:
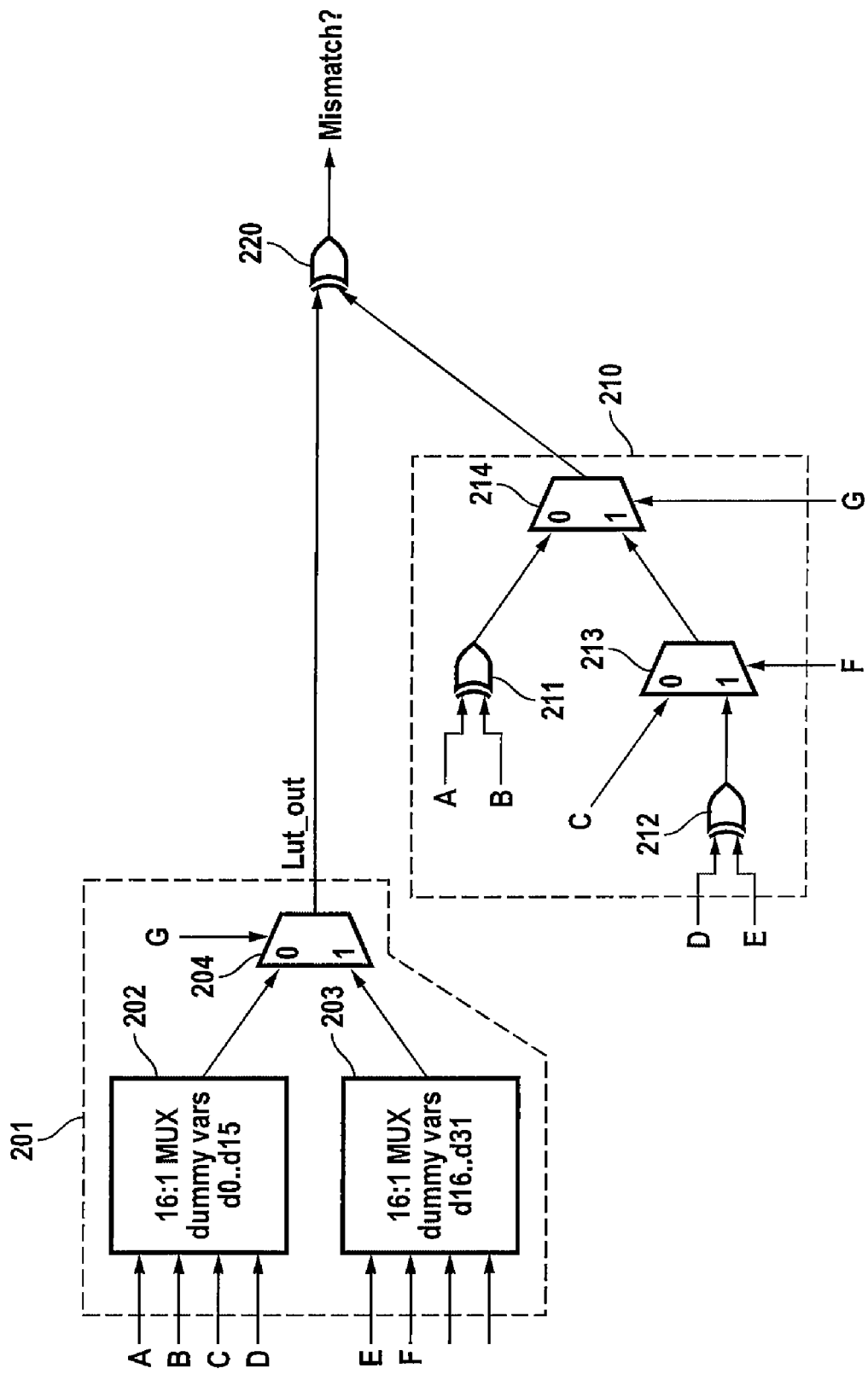
FIG. 2 illustrates an embodiment of the present invention that determines whether an incomplete 9 input LUT can implement a function.

FIG. 2 illustrates how the test procedures described above with respect to FIGS. 1A-1D can be applied to a 9 input incomplete LUT 201. LUT 201 has two 4 input LUTs 202 and 203 and a 2-to1 multiplexer 204. LUTs 202 and 203 are complete LUTs that have 16 bits ($2^4$) of storage space. The inputs of LUTs 202 and 203 are each coupled to 4 inputs of LUT 201. The ninth input of LUT 201 is coupled to the select terminal of multiplexer 204.

XOR gate 220 compares the output of LUT 201 to the output of user function 210. Many functions that users program into programmable integrated circuits do not require all of the storage space that a LUT with the same number of inputs provides. An incomplete LUT such as LUT 201 can implement many user functions, while using substantially less memory storage space than complete LUTs.

User function 210 includes OR gates 211 and 212 and multiplexers 213 and 214. Function 210 receives 7 input signals A-G. According to an embodiment of the present invention, a user function with N input signals can be implemented in an incomplete LUT that has greater than N input terminals. For example, FIG. 2 determines if LUT 201 (with 9 input terminals) can implement function 210 (with 7 input signals). Two input terminals of LUT 201 are not coupled to any of the function's input signals A-G as shown in FIG. 2.

Some of the input signals can be duplicated on more than one input of LUT 201. For example, input signals A and B can be coupled to inputs of LUTs 202 and 203. Duplicating a function's input signals on more than one input of an incomplete LUT can count as an additional rotation/placement of the input signals.

The test system of FIG. 2 is also preferably implemented in software using a binary decision diagram (BDD). LUTs 202 and 203 are each implemented using a 16-to-1 multiplexer or a network of 2-to-1 multiplexers that have 16 inputs. Each of LUTs 202 and 203 receive 16 dummy variables on 16 input data lines. The dummy variables represent possible values for the bits that can be stored in the memory of LUTs 202 and 203. LUT 202 receives 16 dummy variables d0-d5, and LUT 203 receives 16 dummy variables d16-d31. The dummy variables are provided to inputs of the multiplexers in LUTs 202 and 203 as described with respect to FIG. 1C.

The test system of FIG. 2 is repeated for every the binary values of input signals. There are 128 ($2^7$) unique binary values of the 7 input signals A-G. Therefore, the system of FIG. 2 is repeated 128 times, and a different binary value of input signals A-G is used in each repetition. The output signals of all of the XOR gates 220 are fed into an OR gate, as with the embodiment of FIG. 1D.

A BDD is constructed to represent the test system that includes XOR gates and the OR gate that tests each binary value of the function's input signals. All valid paths through the BDD to the zero end point represent the binary values for the dummy variables d0-d31 that will allow the incomplete LUT to implement the function.

If there is not valid path through the BDD to the zero end point, the input signals A-G are permutated with respect to the input terminals of LUT 201. For example, input signals E and F can be coupled to LUT 202, and input signals C and D can be coupled to LUT 203. The tests are then repeated for each binary value of input signals A-G using a new BDD that represents each binary value of the input signals according to the second input permutation.

The tests can be repeated for each possible permutation of the input signals with respect to the input terminals of LUT 201. Tests that provide a duplicate input signal (A-G) to more than one input terminal of LUT 201 are treated as separate rotations from the tests that do not use duplicates of the input signals.

Figure 3:
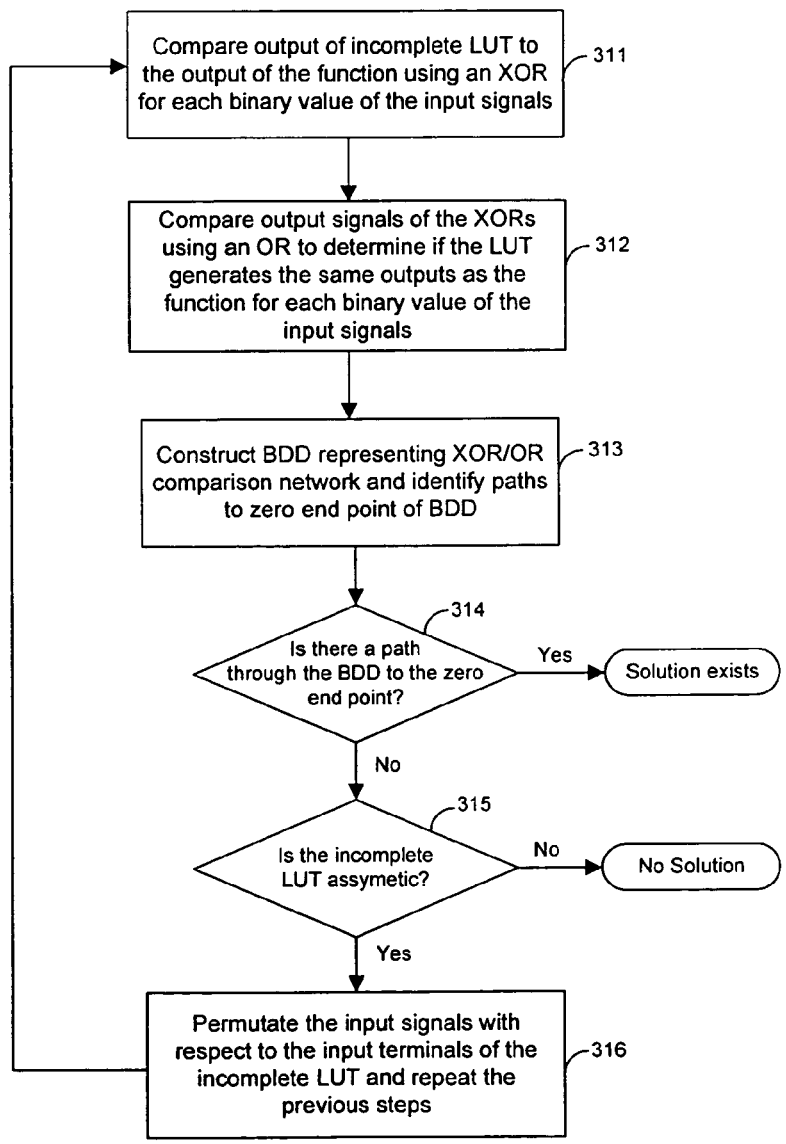
FIG. 3 illustrates a process for determining whether an incomplete LUT with any number of inputs can implement a function according to an embodiment of the present invention.

FIG. 3 is a flow chart that illustrates a generalized process for determining whether an incomplete LUT can implement an N input function according to an embodiment of the present invention. At step 311, the present invention compares output of an incomplete LUT to the output of an arbitrary function using an XOR, for each binary value of the input signals, as described above. At step 312, the output signals of the XORs are OR'ed together to determine if the incomplete LUT generates the same outputs as the function for each binary value of the input signals.

At step 313, a BDD representing the XOR/OR comparison network from step 312 is constructed. Then, any valid paths from the starting node of the BDD that lead to the zero end point are identified. The zero end point represents a zero output of the OR gate. The valid paths through the BDD to the zero end point indicate the binary values that can be stored in the incomplete LUT to implement the function.

At decisional step 314, a determination is made whether a path exists through the BDD to the zero end point. If a path exists to the zero end point, a solution exists and the process is terminated. If a path does not exist to the zero end point, a determination is made at decisional step 315 as to whether the incomplete LUT is asymmetric. If the incomplete LUT is symmetric, a solution does not exist and the process terminates.

If the incomplete LUT is asymmetric, the input signals are permutated with respect to the input terminals of the incomplete LUT at step 316. The previous steps are then repeated. The steps of FIG. 3 are repeated for each non-duplicative permutation of the input signals until a solution is found or until all of the input signal permutations have been tested.

The structure of software that implements the embodiment of FIG. 3 does not need to be changed to accommodate new incomplete LUTs. All that is required is a new data file or a trivial change to explain the function of the new incomplete LUT, which may require a few minutes of work.

Modern circuits are typically implemented in a hardware description language (HDL). These languages usually have the "if-then-else" code structure. The if-then-else code structures can naturally be implemented in 2:1 multiplexers. An incomplete LUT can always be viewed as a network of 2:1 multiplexers fed by inputs and smaller complete LUTs. Programmers often rely on the if-then-else structure to characterize numerous types of functions in their circuit designs. The fact that programmers frequently use the if-then-else structure makes it very natural to match up portions of a user HDL design with incomplete LUTs.

The present invention includes other embodiments for determining whether an incomplete LUT can implement a function. One of these embodiments analyzes software code (e.g., in an HDL) that describes a circuit design that includes functions. A synthesis tool converts the software code for a function in the design into a network of multiplexers and smaller complete LUTs.

The present invention then determines whether the network of multiplexers and complete LUTs can be implemented by an incomplete LUT on the FPGA that has the same or a larger number of inputs. This technique is referred to as pattern matching on the input netlist. The netlist refers to the software code that describes a circuit design.

The following software Code A will be used as an example of this embodiment. Code A implements a function 400 in a circuit design.

Code A:
If (M3)
   OUT=M2
Else
   OUT=M2 or M1
END IF

Figure 4A:
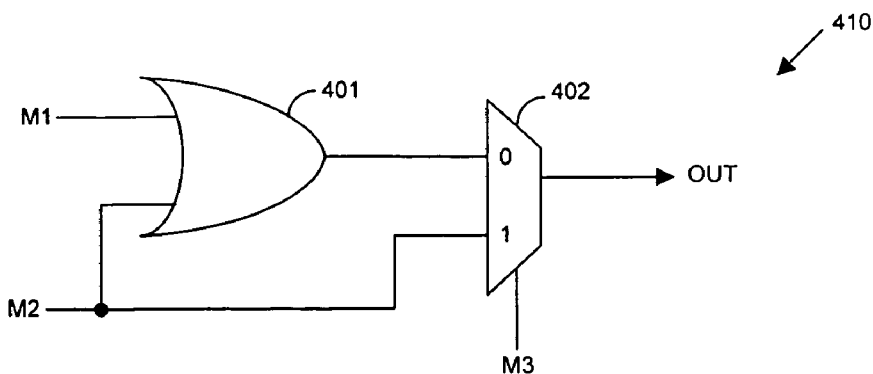
FIG. 4A illustrates a user function that has been mapped into a network including a multiplexer and an OR gate.

A synthesis and technology mapping tool such as Quartus II can convert Code A into a network of multiplexers and smaller LUTs using well known techniques. The output of this conversion is network 410 shown in FIG. 4A that implements function 400. Network 410 includes OR gate 401 and multiplexer 402. Network 410 receives three input signals M1, M2, and M3.

The present invention can analyze network 410 to determine if incomplete LUT 101 shown in FIG. 1A can implement function 400 embodied by network 410. As an example, the following steps of a generic software procedure B can be used to determine whether incomplete LUT 101 can implement function 400.

```
Procedure B:
    For each gate in the network
        If (is_a_2to1_mux (gate))
            X = signal feeding MUX select
            Y = signal feeding MUX data 0
            Z = signal feeding MUX data 1
            If there is a 2 input gate feeding Y
                Q = input 1 on the source gate
                R = input 2 on the source gate
                If Q or R is the same as Z
                    LUT input B = Z
                    LUT input C = X
                    LUT input A = The Q or R that does not match Z
```

Software procedure B is merely an example that is provided for illustrative purposes and is not intended to limit the scope of the present invention. According to the present invention, numerous other procedures are possible for determining whether an incomplete LUT can implement a network of multiplexers and smaller complete LUTs. The pattern matching can be updated to work with any new LUT structure.

Procedure B is now described in further detail. For each gate in network 410, procedure B determines whether the gate is a 2:1 multiplexer using the first If condition. If the gate is a 2:1 multiplexer, procedure B assigns X to the signal feeding the multiplexer 402 select terminal, Y to the signal feeding the multiplexer 402 data 0 input, and Z to the signal feeding the multiplexer 402 data 1 input.

If there is a source gate with 2 inputs that feeds the Y input of multiplexer 402, Q is assigned to the first input of the source gate, and R is assigned to the second input of the source gate. If Q or R are the same signal as Z, then incomplete LUT 101 can implement function 400. In this case, input B of LUT 101 is assigned to input Z of multiplexer 402, input C of LUT 101 is assigned to input X of multiplexer 402, and input A of LUT 101 is assigned to the Q or the R input that does not match input Z. Thus, procedure B determines whether that an incomplete LUT 101 can implement a function, and the order in which the input signals of the function should be assigned to the inputs of the incomplete LUT.

Nesting of if-then-else blocks in user HDL programs is also very common. The nesting of if-then-else blocks leads to trees of multiplexers that also can be mapped into incomplete LUTs using the techniques of the present invention. The following Code C provides an example of the how the present invention can map a function described in a nested if-then statement into an incomplete LUT.

Code C:
If (condition 1)
    If (condition 2)
        OUT=A
    Else
        OUT=B
    END IF
ELSE
    OUT=C
END IF The present invention can easily convert Code C into two 2:1 multiplexers, where the first multiplexer is coupled to an input of the second multiplexer. Inputs A and B feed into the first multiplexer, and input C feeds into the second multiplexer. The select input of the first multiplexer is controlled by condition 1, and the select input of the second multiplexer is controlled by condition 2.

Any arrangement of if-then-else statements can be converted into a desirable multiplexer implementation. For example, moving the block under condition 2 in Code C down to the else half of the first If-Else block produces a symmetric 2 multiplexer result. Adding another If block at any point in the example adds a third multiplexer, but does not disturb the suitability of the code for an incomplete 5 input LUT.

An advantage of this embodiment of the present invention is that the procedures (such as procedure B) are extremely fast to execute. Procedure B, for example, constructs the appropriate ordering for the A, B, and C LUT inputs rather than needing to explore all binary values of the inputs as with the FIGS. 1A-1D embodiment that uses a BDD.

A disadvantage of this embodiment is the fact that the procedures (such as procedure B) that determine whether an incomplete LUT can implement the function have to be customized for every incomplete LUT. Also, there are many functions that can be implemented in an incomplete LUT, but that are not expressed by a particular conversion procedure such as procedure B.

Figure 4B:
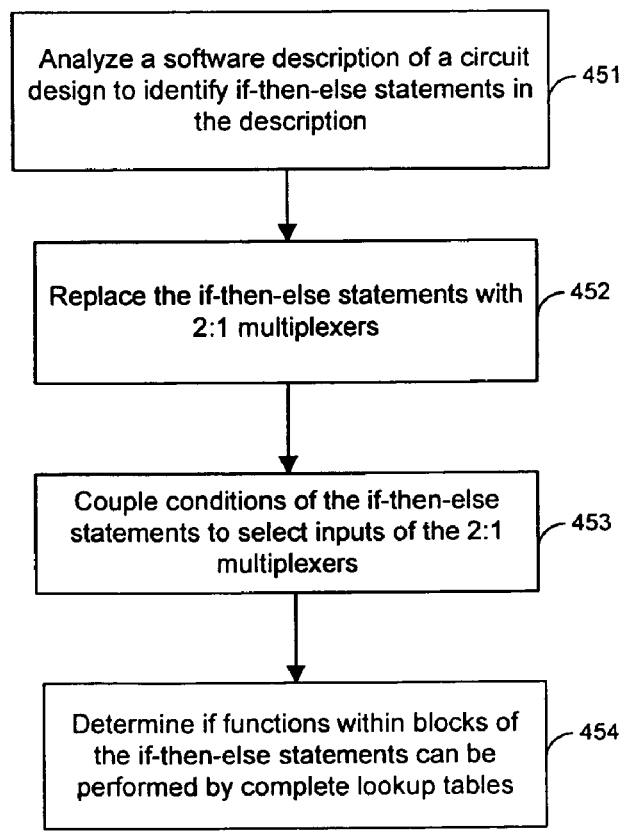
FIG. 4B illustrates a methodology for determining whether an incomplete LUT can implement a function according to a further embodiment of the present invention.

FIG. 4B illustrates an example of a methodology of the present invention that can be used to determine if an incomplete LUT can implement a function. At step 451, a software description of a circuit design in a hardware description language (HDL) is analyzed to identify if-then-else statements in the description. At step 452, the if-then-else statements are replaced with 2:1 multiplexers. At step 453, conditions of the if-then-else statements are coupled to select inputs of the 2:1 multiplexers. At step 454, a determination is made as to whether functions within blocks of the if-then-else statements can be performed by complete lookup tables.

For incomplete LUTs that have a large number of inputs, it becomes less feasible to implement some of the embodiments of the present invention, because the runtime burden increases exponentially with increasing inputs. However, the runtime of the FIG. 4A embodiment of remains close to linear as the number of inputs on an incomplete LUT increases. For example, in the range of 9-12 inputs, it becomes the method of choice given current standards for computing power. For 20 inputs, it is likely to be the only feasible method.

The present invention can also recognize common sub-circuits at the HDL level and replace the sub-circuits directly with technology mapped equivalents. For example, the software can recognize an 8:1 multiplexer function and replace it with two 5 input LUTs implementing 3:1 multiplexers followed by an incomplete 7 input LUT implementing the selection between the two 3:1 multiplexers and the other two data elements. The code used is very similar to the example above. The difference is that logic is selected to be implemented in an incomplete LUT as well as two complete LUTs instead of targeting a single incomplete LUT.

Another embodiment of the present invention for determining whether an incomplete LUT can implement a function is now described. This embodiment has the advantage of being able to recognize all functions that can be implemented by a particular type of incomplete LUT. According to this embodiment, a truth table is constructed for the function under consideration. The truth table variables are tested one by one as candidates for each input position using two types of operations.

The operations involved include co-factoring and dependency checking. Co-factoring involves splitting a truth table into two halves corresponding to a given variable being high and low. Dependency checking involves testing whether the value of a given variable effects the output of a truth table. For example, if the co-factors for a variable are equal, the function does not depend on that variable.

The following generic code is one example of a procedure that can determine whether LUT 101 can implement a particular function. Procedure D below is merely an illustrative example that is not intended to limit the scope of the present invention.

```
Procedure D:
  For each variable V
    Co-factor on V
      If the V = 1 portion of the table depends only on 1 variable and the
        V = 0 portion of the table depends on 2 variables
      Then a solution exists
        The LUT 101 C input is assigned to the variable V signal
        The LUT 101 B input is assigned to the signal appearing in the
           V=1 co-factor
        The LUT 101 A input is the unused signal
```

The appropriate LUT storage contents can be computed from the V=0 co-factor truth table. The LUT storage contents need to be customized for each different incomplete LUT.

Figure 5:
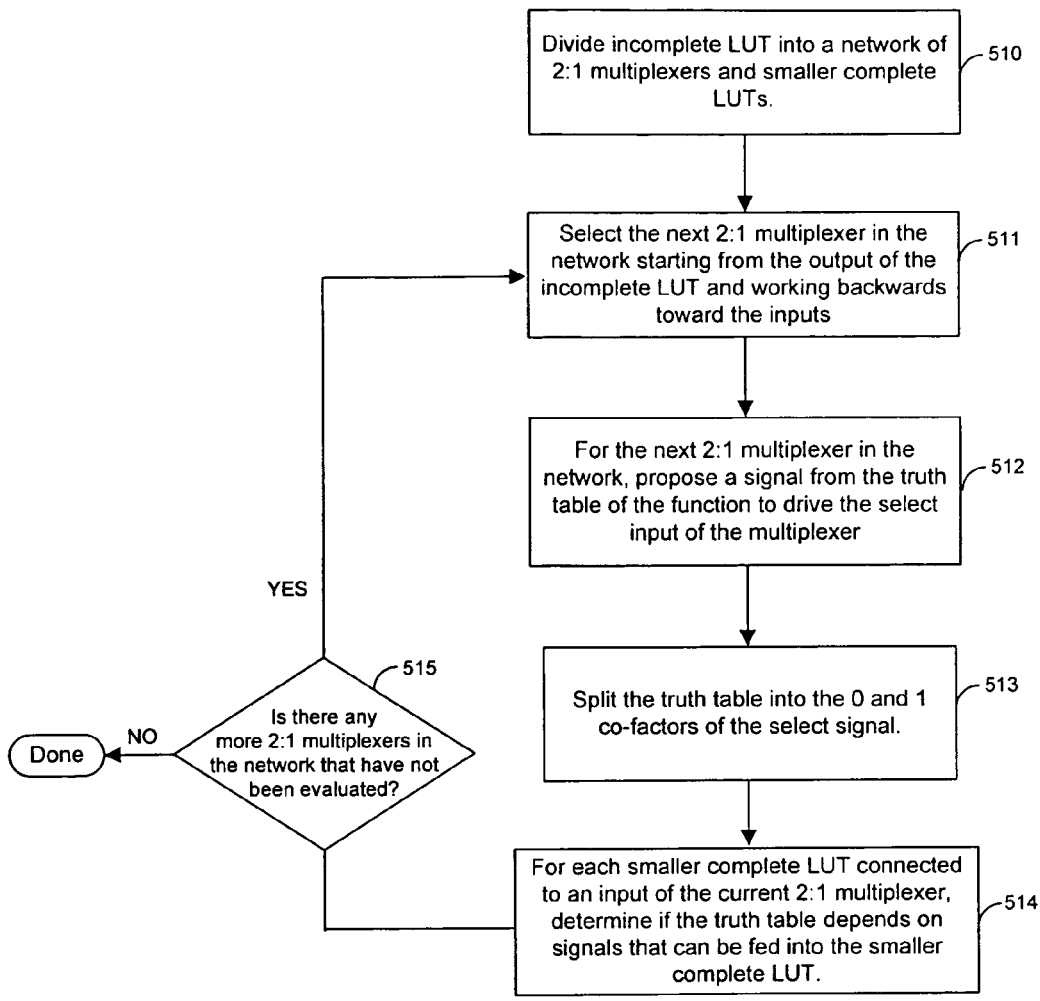
FIG. 5 illustrates another embodiment of the present invention that determines whether an incomplete LUT can implement a function using a truth table.

A more general methodology for determining whether an incomplete LUT can implement a function using a truth table is shown in FIG. 5. At step 510, an incomplete LUT is divided into a network of 2:1 multiplexers and smaller complete LUTs, as discussed above with respect to a previous embodiment. The smaller complete LUTs have less inputs than the incomplete LUT.

At step 511, the next 2:1 multiplexer in the network is selected starting from the output of the incomplete LUT and working backwards towards the inputs of the incomplete LUT. In the first iteration of the methodology, the 2:1 multiplexer that is nearest to the output of the incomplete LUT is selected. At step 512, a select signal from the truth table for the function is proposed to drive the select terminal of the 2:1 multiplexer.

At step 513, the truth table for the function is split into the 0 and 1 co-factors of the select signal. For each smaller complete LUT connected to an input of the current 2:1 multiplexer, the truth table is checked at step 514 to determine if the truth table depends on variables that can be fed into one of the smaller complete LUTs.

At decisional step 515, the network is analyzed to determine if there are any more 2:1 multiplexers that have not been evaluated yet. If all of the 2:1 multiplexers in the network have been evaluated, the process terminations. If there are 2:1 multiplexers in the network that have not been evaluated, steps 511-514 are repeated for the next 2:1 multiplexer.

An example of a specific process for implementing this embodiment for incomplete 9 input LUT 201 is now discussed. Incomplete 9 input LUT 201 is divided into two complete LUTs that each have 4 inputs and a 2:1 multiplexer. The two LUTs feed into the 2:1 multiplexer. The select input of the multiplexer is controlled by the ninth input signal.

According to this example process, a truth table is built for a function in a user circuit that has up to 9 inputs. For each input signal S of the function, a co-factor of the complete 9 input truth table is built for the case where S=0. The S=0 co-factor truth table is checked for dependency on 4 or fewer variables. If the S=0 co-factor truth table depends on more than 4 variables, the process skips ahead to the next S input signal.

For each input signal S of the function, a co-factor of the complete 9 input truth table is built for the case were S=1. The S=1 co-factor truth table is checked for dependency on 4 or fewer variables. If the S=0 co-factor truth table depends on more than 4 variables, the process skips ahead to the next S input signal.

If the process has not skipped the first S input signal because the S=0 and the S=1 co-factor truth tables each depend on 4 or less variables, the incomplete 9 input LUT can implement the function. The S=1 co-factor truth table is applied to one of the 4 input complete LUTs, and the S=0 co-factor truth table is applied to the second 4 input complete LUT. The S input signal that lead to the solution is applied to the select terminal of the 2:1 multiplexer. If the first iteration of the process fails, the process considers all of the other S input signals to determine if a solution can be found.

According to another embodiment of the present invention, the truth table embodiment is implemented using binary decision diagram (BDD) operations instead of a truth table. Co-factoring a variable is equivalent to rotating that variable to the top of the BDD and considering the high and low branches of the BDD that correspond to high and low co-factors, as described above. Thus, the 1 and the 0 co-factors of a variable of a function are the high and low branches of the BDD. Dependency checking is implemented in a BDD by traversing down the BDD tree looking for a node on that variable's level. The variables can be reordered or rotated into any order. The coding complexity and runtime of this embodiment of roughly equivalent to the truth table embodiment.

The techniques of the present invention can be used as part of a technology mapping process to convert a circuit design into a network of LUTs and other circuit elements that can be programmed into a programmable logic integrated circuit. Programmable logic integrated circuits include programmable logic devices (PLDs), field programmable gate arrays (FPGAs), programmable logic arrays, configurable logic arrays, etc.

Figure 6A:
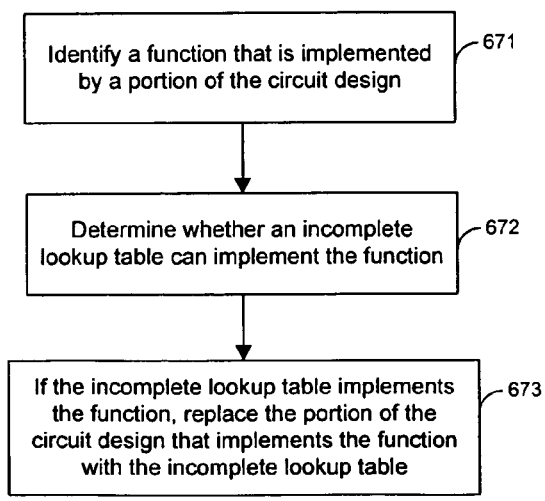
FIG. 6A illustrates a generalized technology mapping methodology for converting a circuit design into an equivalent circuit that includes incomplete lookup tables according to an embodiment of the present invention.

FIG. 6A illustrates a generalized technology mapping methodology for converting a circuit design into an equivalent circuit that includes incomplete lookup tables. At step 671, a function that is implemented by a portion of the circuit design is identified. At step 672, a determination is made as to whether an incomplete lookup table can implement the function. At step 673, the portion of the circuit design that implements the function is replaced with the incomplete lookup table, if the incomplete lookup table implements the function.

Figure 6B:
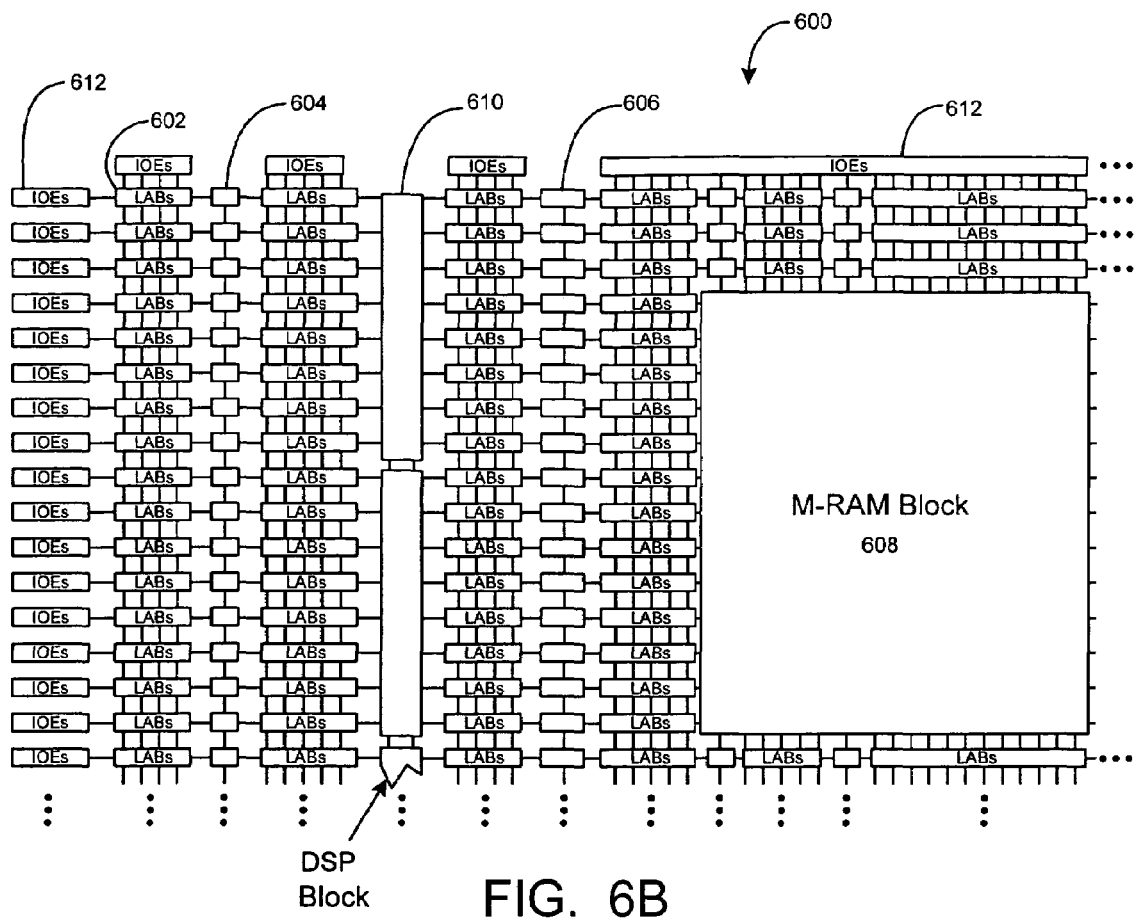
FIG. 6B is a simplified block diagram of a programmable logic device that can be used with the techniques of the present invention.

FIG. 6B is a simplified partial block diagram of an example of a PLD 600. The techniques of the present invention can used to technology map a circuit design onto a PLD such as PLD 600. It should be understood that the present invention can be applied to numerous types of programmable integrated circuits. PLD 600 is an example of a programmable integrated circuit for which techniques of the present invention can be implemented. PLD 600 includes a two-dimensional array of programmable logic array blocks (or LABs) 602 that are interconnected by a network of column and row interconnects of varying length and speed. LABs 602 include multiple (e.g., 10) logic elements (or LEs).

An LE is a programmable logic block that provides for efficient implementation of user defined logic functions. PLD 600 has numerous logic elements that can be configured to implement various combinatorial and sequential functions. The logic elements have access to a programmable interconnect structure. The programmable interconnect structure can be programmed to interconnect the logic elements in almost any desired configuration.

PLD 600 also includes a distributed memory structure including RAM blocks of varying sizes provided throughout the array. The RAM blocks include, for example, 512 bit blocks 604, 4K blocks 606 and a M-RAM block 608 providing 512K bits of RAM. These memory blocks can also include shift registers and FIFO buffers.

PLD 600 further includes digital signal processing (DSP) blocks 610 that can implement, for example, multipliers with add or subtract features. I/O elements (IOEs) 612 located, in this example, around the periphery of the device support numerous single-ended and differential I/O standards. It is to be understood that PLD 600 is described herein for illustrative purposes only and that the present invention can be implemented for many different types of PLDs, FPGAs, and the like.

Figure 7:
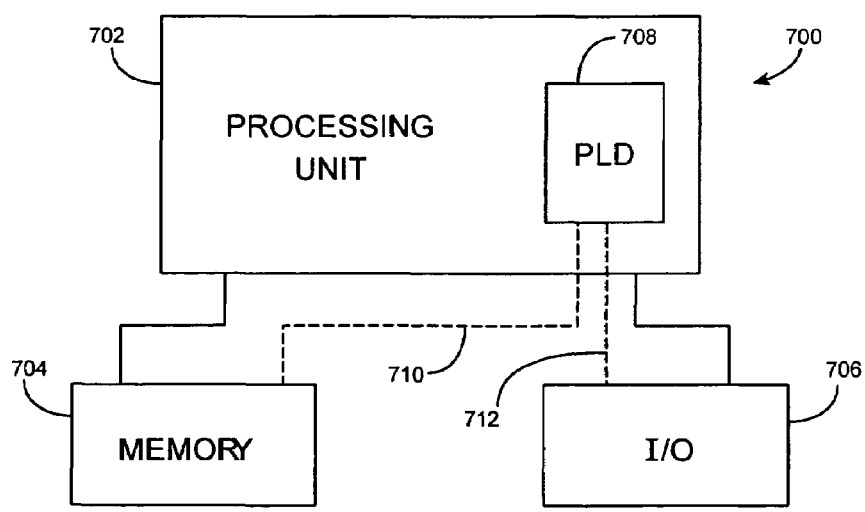
FIG. 7 is a block diagram of an electronic system that can implement embodiments of the present invention.

While PLDs of the type shown in FIG. 6B provide many of the resources required to implement system level solutions, the present invention can also benefit systems wherein a PLD is one of several components. FIG. 7 shows a block diagram of an exemplary digital system 700, for which the present invention can be implemented. System 700 can be a programmed digital computer system, digital signal processing system, specialized digital switching network, or other processing system. Moreover, such systems can be designed for a wide variety of applications such as telecommunications systems, automotive systems, control systems, consumer electronics, personal computers, Internet communications and networking, and others. Further, system 700 can be provided on a single board, on multiple boards, or within multiple enclosures.

System 700 includes a processing unit 702, a memory unit 704 and an I/O unit 706 interconnected together by one or more buses. According to this exemplary embodiment, a programmable logic device (PLD) 708 is embedded in processing unit 702. PLD 708 can serve many different purposes within the system in FIG. 7. PLD 708 can, for example, be a logical building block of processing unit 702, supporting its internal and external operations. PLD 708 is programmed to implement the logical functions necessary to carry on its particular role in system operation. PLD 708 can be specially coupled to memory 704 through connection 710 and to I/O unit 706 through connection 712.

Processing unit 702 can direct data to an appropriate system component for processing or storage, execute a program stored in memory 704 or receive and transmit data via I/O unit 706, or other similar function. Processing unit 702 can be a central processing unit (CPU), microprocessor, floating point coprocessor, graphics coprocessor, hardware controller, microcontroller, programmable logic device programmed for use as a controller, network controller, and the like. Furthermore, in many embodiments, there is often no need for a CPU.

For example, instead of a CPU, one or more PLDs 708 can control the logical operations of the system. In an embodiment, PLD 708 acts as a reconfigurable processor, which can be reprogrammed as needed to handle a particular computing task. Alternately, programmable logic device 708 can itself include an embedded microprocessor. Memory unit 704 can be a random access memory (RAM), read only memory (ROM), fixed or flexible disk media, PC Card flash disk memory, tape, or any other storage means, or any combination of these storage means.

While the present invention has been described herein with reference to particular embodiments thereof, a latitude of modification, various changes, and substitutions are intended in the present invention. In some instances, features of the invention can be employed without a corresponding use of other features, without departing from the scope of the invention as set forth. Therefore, many modifications may be made to adapt a particular configuration or method disclosed, without departing from the essential scope and spirit of the present invention. It is intended that the invention not be limited to the particular embodiments disclosed, but that the invention will include all embodiments and equivalents falling within the scope of the claims.

What is claimed is:

1. A computer program product having computer program code stored on a computer readable medium that is configured to convert a circuit design into an equivalent circuit that includes incomplete lookup tables, the computer program product comprising:
   code for identifying a function that is implemented by a portion of the circuit design, the function having input signals;
   code for determining whether an incomplete lookup table implements the function in the circuit design, wherein the code for determining whether the incomplete lookup table implements the function in the circuit design further comprises:
   code for comparing outputs of the function with outputs of the incomplete lookup table for each binary value of the input signals; and
   code for determining if the incomplete lookup table generates the same outputs as the function for each of the binary values of the input signals; wherein the incomplete lookup table has N inputs and less than $2^N$ bits of storage; and
   code for replacing the portion of the circuit design that implements the function with the incomplete lookup table if the incomplete lookup table implements the function.

2. The computer program product according to claim 1 wherein the code for determining whether the incomplete lookup table implements the function in the circuit design further comprises:
   code for comparing outputs of the function with outputs of the incomplete lookup table using an XOR function, for each binary value of the input signals; and
   code for evaluating outputs of the XOR functions using an OR function to determine if the incomplete lookup table generates the same outputs as the function for each of the binary values of the input signals.

3. The computer program product according to claim 2 wherein the code for determining whether the incomplete lookup table implements the function in the circuit design further comprises:
   code for creating a binary decision diagram for the XOR functions and the OR function; and
   code for determining if a path exists through the binary decision diagram to a zero end point of the binary decision diagram.

4. The computer program product according to claim 3 wherein the code for determining whether the incomplete lookup table implements the function in the circuit design further comprises:
   code for swapping the input signals of the function with respect to the inputs of the incomplete lookup table, if the incomplete lookup table is asymmetric.

5. The computer program product according to claim 1 wherein the code for determining whether the incomplete lookup table implements the function in the circuit design further comprises:
   code for converting the function in the circuit design into a network of 2:1 multiplexers and complete lookup tables.

6. The computer program product according to claim 5 wherein the code for converting the function in the circuit design into the network of 2:1 multiplexers and complete lookup tables further comprises:
   code for analyzing a software description of the circuit design to identify if-then-else statements in the description; and
   code for replacing the if-then-else statements with the 2:1 multiplexers.

7. The computer program product according to claim 6 wherein the code for converting the function in the circuit design into the network of 2:1 multiplexers and complete lookup tables further comprises:
   code for coupling conditions of the if-then-else statements to select inputs of the 2:1 multiplexers; and
   code for determining if functions within blocks of the if-then-else statements are performed by complete lookup tables.

8. The computer program product according to claim 1 wherein the code for determining whether the incomplete lookup table implements the function in the circuit design further comprises:
   code for dividing the incomplete lookup table into a network 2:1 multiplexers and smaller complete lookup tables;
   code for selecting a 2:1 multiplexer in the network;
   code for proposing a signal from a truth table for the function to drive a select input of the selected 2:1 multiplexer;
   code for splitting the truth table into 0 and 1 co-factors of the select signal; and
   code for determining if the truth table depends on signals that are fed into the smaller complete lookup tables.

9. The computer program product according to claim 1 wherein the code for determining whether the incomplete lookup table implements the function in the circuit design further comprises:

code for dividing the incomplete lookup table into a network 2:1 multiplexers and smaller complete lookup tables;

code for selecting a 2:1 multiplexer in the network;

code for proposing a signal from a binary decision diagram (BDD) for the function to drive a select input of the selected 2:1 multiplexer;

code for splitting the BDD into 0 and 1 co-factors of the select signal; and code for determining if the BDD depends on signals that are fed into the smaller complete lookup tables.

10. The computer program product according to claim 1 wherein the incomplete lookup table is programmed into circuit elements on a programmable logic integrated circuit.

11. A method for converting a circuit design into an equivalent circuit that includes incomplete lookup tables, the method comprising:

identifying a function that is implemented by a portion of the circuit design, the function having input signals;

determining whether an incomplete lookup table (LUT) implements the function in the circuit design, wherein determining whether the incomplete LUT implements the function further comprises:

comparing outputs of the function with outputs of the incomplete LUT for each binary value of the input signals; and determining if the incomplete LUT generates the same outputs as the function for each of the binary values of the input signals, wherein the incomplete LUT has N inputs and less than $2^N$ bits of storage; and replacing the portion of the circuit design that implements the function with the incomplete LUT if the incomplete LUT implements the function.

12. The method defined in claim 11 wherein determining whether the incomplete LUT implements the function further comprises:

comparing outputs of the function with outputs of the incomplete LUT using an XOR function, for each binary value of the input signals;

evaluating outputs of the XOR functions using an OR function to determine if the incomplete LUT generates the same outputs as the function for each of the binary values of the input signals;

creating a binary decision diagram for the XOR functions and the OR function; and determining if a path exists through the binary decision diagram to a zero end point of the binary decision diagram.

13. The method defined in claim 12 wherein determining whether the incomplete LUT implements the function in the circuit design further comprises:

swapping the input signals of the function with respect to the inputs of the incomplete LUT, if the incomplete LUT is asymmetric.

14. The method defined in claim 11 wherein determining whether the incomplete LUT implements the function in the circuit design further comprises:

converting the function in the circuit design into a network of 2:1 multiplexers and complete lookup tables.

15. The method defined in claim 11 wherein determining whether the incomplete LUT implements the function in the circuit design further comprises:

dividing the incomplete lookup table into a network 2:1 multiplexers and smaller complete lookup tables;

selecting a 2:1 multiplexer in the network;

proposing a signal from a truth table for the function to drive a select input of the selected 2:1 multiplexer;

splitting the truth table into 0 and 1 co-factors of the select signal; and determining if the truth table depends on signals that can be fed into the smaller complete lookup tables.

16. The method defined in claim 11 wherein determining whether the incomplete LUT implements the function in the circuit design further comprises:

dividing the incomplete lookup table into a network 2:1 multiplexers and smaller complete lookup tables;

selecting a 2:1 multiplexer in the network;

proposing a signal from a binary decision diagram (BDD) for the function to drive a select input of the selected 2:1 multiplexer;

splitting the BDD into 0 and 1 co-factors of the select signal; and determining if the BDD depends on signals that are fed into the smaller complete lookup tables.

17. The method defined in claim 11 further comprising:

placing the circuit design including the incomplete LUT on a programmable logic integrated circuit.

18. A system for determining whether an incomplete lookup table (LUT) implements a function, wherein the incomplete LUT has N inputs and less than $2^N$ bits of storage, the system comprising:

means for comparing outputs of the function with outputs of the incomplete LUT using an XOR function, for each binary value of the input signals;

means for evaluating outputs of the XOR functions using an OR function to determine if the incomplete LUT generates the same outputs as the function for each of the binary values of the input signals;

means for creating a binary decision diagram for the XOR functions and the OR function;

means for determining if a path exists through the binary decision diagram to a zero end point of the binary decision diagram; and means for swapping the input signals of the function with respect to the inputs of the incomplete lookup table, if the incomplete lookup table is asymmetric.

* * * * *